United States Patent [19]

Chowdhry et al.

[11] Patent Number: 4,814,303
[45] Date of Patent: Mar. 21, 1989

[54] ANORTHITE-CORDIERITE BASED CERAMICS FROM ZEOLITES

[75] Inventors: Uma Chowdhry, Wilmington, Del.; David R. Corbin, West Chester, Pa.; Munirpallam A. Subramanian, New Castle, Del.

[73] Assignee: E. I. Du Pont de Nemours and Company, Wilmington, Del.

[21] Appl. No.: 101,306

[22] Filed: Sep. 25, 1987

[51] Int. Cl.⁴ ............... C04B 35/18; C04B 35/20; C04B 35/22

[52] U.S. Cl. ................... 501/119; 501/122; 501/128; 423/328

[58] Field of Search ............ 501/119, 128, 122; 423/328

[56] References Cited

U.S. PATENT DOCUMENTS

| | | | |
|---|---|---|---|
| 1,759,919 | 5/1930 | Singer | 423/328 |
| 2,102,976 | 12/1937 | Seil | 423/328 |
| 2,920,971 | 1/1960 | Stookey | 106/39 |
| 3,365,314 | 1/1968 | Sack | 106/39 |
| 3,365,318 | 1/1968 | Nameishi | 501/128 |
| 3,490,888 | 1/1970 | Strong | 65/33 |
| 3,531,303 | 9/1970 | Bahat | 106/39 |
| 3,826,813 | 7/1974 | Gardner et al. | 423/328 |
| 3,885,977 | 5/1975 | Lachman et al. | 106/62 |
| 3,926,648 | 12/1975 | Miller | 106/39.6 |
| 3,940,255 | 2/1976 | Harrington et al. | 65/33 |
| 3,954,672 | 5/1976 | Somers et al. | 252/455 R |
| 3,979,216 | 9/1976 | Fritsch, Jr. et al. | 106/62 |
| 4,033,779 | 7/1977 | Winkler | 106/62 |
| 4,063,955 | 12/1977 | Frtisch, Jr. et al. | 106/39.6 |
| 4,125,408 | 11/1978 | Pieper | 106/62 |
| 4,142,879 | 3/1979 | Fritsch, Jr. et al. | 65/18 |
| 4,162,921 | 7/1979 | Litvinov et al. | 106/39.8 |
| 4,187,115 | 2/1980 | Reade | 106/39.8 |
| 4,194,917 | 3/1980 | Sakemi et al. | 106/62 |
| 4,235,855 | 11/1980 | Cleveland | 423/327 |
| 4,280,845 | 7/1981 | Matsuhisa et al. | 106/62 |
| 4,300,953 | 11/1981 | Lachman | 501/112 |
| 4,304,603 | 12/1981 | Grossman et al. | 501/9 |
| 4,316,965 | 2/1982 | Oda et al. | 501/128 |
| 4,403,017 | 9/1983 | Bind | 428/702 |
| 4,434,117 | 2/1984 | Inoguchi et al. | 264/56 |
| 4,460,916 | 7/1984 | Hashimoto et al. | 357/80 |
| 4,495,300 | 1/1985 | Sano | 501/102 |
| 4,555,493 | 11/1985 | Watson et al. | 501/128 |
| 4,568,402 | 2/1986 | Ogawa et al. | 501/119 |
| 4,576,919 | 3/1986 | Hodge | 501/9 |
| 4,587,067 | 5/1986 | Agrawal et al. | 264/63 |

OTHER PUBLICATIONS

R. A. Gdula, Am. Ceram. Soc. Bull. 50[6], 555 (1971).
I. Uei et al., J. Ceram. Assoc. Japan 74[10]; 325 (1966).
K. Hayashi et al., Mem. Fac. Ind. Arts, Kyoto Tech. Univ., Sci. Technol. 29, 58 (1980).
R. Morrell, Proc. Br. Ceram. Soc. 28, 53 (1979).
D. R. Bridge et al., Glass Technology 26[6], 286 (1985).
Mussler et al., Am. Ceram. Soc. Bull. 63[5], 705 (1984).
B. H. Mussler et al., Am. Ceram. Soc. Bull. 64[11], 1459 (1985).
D. W. Breck, Zeolite Molecular Sieves, John Wiley & Sons, New York (1974).
Miecznikowski et al., Roczniki Chem. 51, 1955 (1977).
D. Rykl et al., Crystal Res. & Technol., 19, 549 (1984).
D. Rykl et al., Zeolites 5, 389 (1985).
C.-Y. Li et al., Zeolites 6, 60 (1986).
M. Koizumi et al., Jour. Geol. 68, 41 (1960).
D. W. Breck, Zeolite Molecular Sieves, John Wiley & Sons, New York (1974).

Primary Examiner—William R. Dixon, Jr.
Assistant Examiner—David M. Brunsman

[57] ABSTRACT

Process for producing monolithic ceramic articles by sintering at temperatures from about 900° C. to about 1350° C. a shaped zeolite charge comprised of selected zeolites with Si/Al ratios of from about 0.7 to about 5.

8 Claims, No Drawings

ANORTHITE-CORDIERITE BASED CERAMICS FROM ZEOLITES

BACKGROUND OF THE INVENTION

Field of the Invention

This invention relates to the process of directly sintering zeolites to make a ceramic article and, in particular, to make a dense, hermetic ceramic article for use as a substrate for electronic circuits.

SUMMARY OF THE BACKGROUND

Ceramics with an aluminosilicate framework are well-known in the art. These ceramics have been formed either by melting the appropriate oxides in appropriate proportions to form a glass and then heating the glass powder to crystallize a crystalline phase from the glass or by sintering the oxides at a temperature somewhat below that needed to form a melt.

Such ceramics and ceramic articles have many uses. These include, for example, uses as porcelin, china, refractory articles, heat exchangers, turbine engine components, catalyst supports, cookingware, sparkplug bodies, electrical insulators, radomes, substrates for integrated circuits, etc.

In electronic devices, a substrate for silicon circuit chips should have low dielectric constant, low dielectric loss, high d.c. electrical resistance, suitable thermal expansion properties, and be well-sintered with low porosity. Alumina and alumina-based materials have been used as ceramic substrates but alumina has a dielectric constant of about 9, which is higher then desired, and a linear thermal expansion coefficient of about $7 \times 10^{-6}$ °C.$^{-1}$, which is not closely enough matched to the linear thermal expansion coefficient of silicon of $3.7 \times 10^{-6}$ °C.$^{-1}$.

Ceramics based on certain aluminosilicates have been proposed as substrates and have been shown to have lower dielectric constants than alumina and linear thermal expansion coefficients better matched to that of silicon. In particular, ceramics based on anorthite ($CaO \cdot Al_2O_3 \cdot 2SiO_2$) and cordierite ($2MgO \cdot 2Al_2O_3 \cdot 5SiO_2$) have been shown to have attractive properties for use as substrates for electronic circuits.

Prior art references that disclose the process whereby the appropriate oxides are melted in appropriate proportions to form a glass and then the glass powder is heated to crystallize a crystalline phase from the glass include the following.

I. Uei et al., J. Ceram. Assoc. Japan, 74[10], 325 (1966), disclose a process for forming dense cordierite ceramics by heating at 1550–1650° C. the component oxides $Al_2O_3$, $SiO_3$, and MgO in proportions corresponding to the composition of cordierite, quenching the resultant melt to form a glass, crushing the glass, and sintering glass powder compacts at temperatures of 900° C. to 1200° C.

K. Hayashi et al., Mem. Fac. Ind. Arts, Kyoto Tech. Univ., Sci. Technol. 29, 58 (1980), disclose the application of the Uei et al. process described above to form calcium-alumino-silicate ceramics. Mixtures of $CaCO_3$, $Al_2O_3$, and $SiO_2$ were melted at 1650° C. When fired at 1000° C. to 1400° C., the glass powder compacts corresponding to appropriate compositions resulted in dense, sintered ceramics in which the only crystalline phase was anorthite. Mixtures of anorthite-gehlenite resulted in linear thermal expansion coefficients of $4.04$–$7.95 \times 10^{-6}$ °C.$^{-1}$.

Stookey, U.S. Pat. No. 2,920,971, discloses a method for making dense ceramics, said method comprising melting a glass-making composition containing 2–20 wt % $TiO_2$ as a nucleating agent, cooling to form a glass, heating the glass to a temperature between the maximum nucleation temperature and the annealing temperature of the glass, and then heating the glass to a temperature at which the glass-making ingredients crystallize. The crystalline phases formed include anorthite and cordierite.

Sack, U.S. Pat. No. 3,365,314, discloses a method for producing crystalline articles containing predominantly cordierite, anorthite, spinel, and forsterite by heating a shaped article formed from a mixture of magnesium oxide powder and a high-alumina silicate glass at a temperature up to 1400° C. The articles so produced are reported to have linear thermal expansion coefficients of $4.5$–$10.7 \times 10^{-6}$ °C.$^{-1}$, dielectric constants between 8 and 10, and a dielectric power factor of $2$–$6 \times 10^{-4}$ at 10 MHz.

Prior art references that disclose the process wherein the oxides are sintered at a temperature somewhat below that needed to form a melt include the following.

R. A. Gdula, Am. Ceram. Soc. Bull. 50[6], 555 (1971), discloses the production of dense anorthite ceramics having a dielectric constant of 6.2 at 1 MHz and a linear thermal expansion coefficient of $4.82 \times 10^{-6}$ °C.$^{-1}$ by firing $CaCO_3$, kaolin, and $Al_2O_3$ in appropriate proportions at 1425° C. The direct sintering of the component oxides of this and other aluminosilicates results in dense ceramics over only a narrow temperature range.

Bind, U.S. Pat. No. 4,403,017, discloses a method of manufacturing a ceramic single phase structure having improved thermal expansion and sintering characteristics and having the cordierite structure. The method comprises milling, until finely divided and thoroughly mixed, a mixture of about 2 moles of MgO, about 2 moles of $Al_2O_3$ and about 5 moles divided between $SiO_2$ and $GeO_2$, forming said mixture into a desired shape, gradually heating said shape to a temperature at which sintering occurs and a cordierite structure is formed (from about 1250° C. to 1400° C.), and gradually cooling said structure.

Formation of mineral powders from zeolites has been observed in studies related to the thermal stability of zeolites. D. W. Breck, Zeolite Molecular Sieves, John Wiley & Sons, New York (1974), notes on pages 493–94 that when heated in air at elevated temperatures, "the crystal structure of zeolites ultimately breaks down, resulting in the formation of an amorphous solid and recrystallization to some nonzeolitic species." One example given is the heating of zeolite Mg-X at 1500° C. to form a glass and the heating of the glass at 1000° C. to form cordierite.

Miecznikowski et al., Roczniki Chem. 51, 1955 (1977), have investigated the stability of ultrastable zeolites prepared by the dealumination of the ammonium zeolites Y with tartaric acid. The zeolite framework collapses at 1030° C. At about 1065° C., the amorphous phase begins to crystallize as a mullite phase. At 1120° C., there is $\beta$-cristobalite as well as the mullite, and the degree of crystallinity of these two phases increases as the calcining temperature is increased to 1350° C.

D. Rykl et al., Crystal Res. & Technol., 9, 549 (1984) disclose that the natural zeolite laumontite is stable up to 420° C. and that above that temperature a new unidentified phase forms. At 50° C., both the laumontite and the unidentified phase collapse and anorthite begins to form from the amorphous phase and, at 1000° C., the laumontite is transformed to anorthite and $SiO_2$.

D. Rykl et al., Zeolites 5, 389 (1985), investigated the stability of the natural zeolite, stilbite. Above 260° C., there is a transformation to a psuedo-orthohombic metastilbite phase and from 350–470° C. this is the only phase present. Above 470° C., metastilbite begins to decompose into an amorphous phase, which gives rise to, at increasing temperature, quartz, wollastonite, and nephaline. This process is completed at 1000° C.

C.-Y. Li et al., Zeolites 6, 60 (1986), investigated the thermal stability of Na-, Ca-, and La-forms of synthetic faujasite. The crystal collapse temperature for the sodium form increases from about 840° C. to about 980° C. as the Si/Al ratio increases from 1.2 to 7.0. The crystal collapse temperatures for the calcium and lanthanum forms increase from 945° C. for the Ca-form and 960° C. for the La-form when the Si/Al ratio is 1.2 to just over 1000° C. when the Si/Al ratio is 7.0.

M. Koizumi et al., Jour. Geol. 68, 41 (1960), investigated the stability of various calcium zeolites under hydrothermal conditions. Anorthite was among the products formed.

D. W. Breck, Zeolite Molecular Sieves, John Wiley & Sons, New York (1974), discusses the hydrothermal transformation of zeolites beginning on page 483. These transformations are generally dependent on temperature and time. At 20,000 psi ($1.4 \times 10^2$ MPa), the zeolite Na-X converts to an analcime-type structure at 240° C. Mg-X converts to a layer-type, smectite-type structure at above 180° C., and Ca-X converts to anorthite at above 300° C.

None of these studies teaches a process of making a monolithic anorthite, anorthite-cordierite or cordierite based ceramic from zeolites. None recognizes the instant process of making a dense, hermetic, anorthite, anorthite-cordierite or cordierite based ceramic suitable for use as a substrate for electronic applications. This invention provides a process for making such ceramic articles wherein there is only a single firing and the firing temperature can be relatively low, i.e., the order of 1000° C., and the firing time can be relatively short, i.e., a few hours.

SUMMARY OF THE INVENTION

This invention provides a process for producing a monolithic ceramic article, said process comprising sintering at a temperature of from about 900° C. to about 1350° C., preferably at temperatures from about 950° C. to about 1050° C., a shaped zeolite charge comprised of one or more zeolites chosen from the group consisting of zeolites with Si/Al ratios of from about 0.7 to about 6. Preferred are the zeolites with Si/Al ratios of from about 0.7 to about 3.

In particular, this invention provides a process for producing a monolithic anorthite, anorthite-cordierite or cordierite based ceramic article when said zeolites are chosen from the group consisting of the Ca-forms, the (Ca,Mg)-forms, and the Mg-forms of zeolites X, Y, and A. These zeolites necessarily have Si/Al ratios of from about 0.7 to 3.

In a preferred embodiment, the process produces a monolithic anorthite, anorthite-cordierite or cordierite based ceramic article that is dense and hermetic when the zeolites are chosen from the group consisting of the Ca-forms, the (Ca,Mg)-forms and the Mg-forms of zeolites X, Y, and A such that the shaped zeolite charge has a Si/Al ratio of from about 1.1 to about 2.5. Preferably, the zeolite charge has a Si/Al ratio of from about 1.1 to about 1.4. Additionally, the preferred temperature for sintering the shaped zeolite charge is from about 950° C. to about 1050° C.

In a more preferred embodiment, the process produces a monolithic anorthite, anorthite-cordierite or cordierite based ceramic article that is dense and hermetic and is suitable for use as a substrate for electronic circuits when the shaped zeolite charge is sintered at a temperature of from about 950° C. to about 1350° C., preferably at a temperature from about 950° C. to about 1050° C., and the zeolites are chosen from the group consisting of the Ca-forms, the (Ca,Mg)-forms, and the Mg-forms of zeolites X, Y, and A such that the shaped zeolite charge has (i) a Si/Al ratio of from about 1.1 to about 2.5, preferably from about 1.1 and about 1.4, (ii) a Na/(Si+Al) ratio less than about 0.08, preferably less than about 0.02, and (iii) a (Ca+Mg)/(Si+Al) ratio of at least about 0.11.

The resulting ceramics have low dielectric constant, low dielectric loss, high d.c. resistivity, and low thermal expansion (matching closely to that of Si), and therefore are suitable for microelectronic substrate applications.

DETAILED DESCRIPTION OF THE INVENTION

Zeolites can be described generically as complex aluminosilicates characterized by a three-dimensional framework enclosing cavities occupied by ions and water molecules, all of which can move with significant freedom within the zeolite matrix. In commercially useful zeolites, the water molecules can be removed from or replaced within the framework without destroying its geometry. Zeolites can be represented by the following formula:

$$M_{2/n}O \bullet Al_2O_3 \bullet x\ SiO_2 \bullet y\ H_2O.$$

wherein M is a cation of valence n, x is generally equal to or greater than 2, and y is a number determined by the porosity and the hydration state of the zeolite, generally from 2 to 8. In naturally occurring zeolites, M is principally represented by Na, Ca, K, Mg, and Ba in proportions usually reflecting their approximate geochemical abundance. The M cations are loosely bound to the structure and frequently can be completely or partially replaced with other cations by conventional ion exchange.

Zeolite structure consists of corner-linked tetrahedra with Al or Si atoms at the centers of tetrahedra and oxygen atoms at the corners. Such tetrahedra are combined in a well-defined, repeating structure comprising various combinations of 4-, 6-, 8-, 10-, and 12-membered rings. The resulting framework consists of regular channels and cages. Useful references relating generally to zeolite structure and characterization include the following:

Meier et al., Atlas of Zeolite Structure Types (International Zeolite Assn. 1978);

Mumpton, "Natural Zeolites" in Reviews in Mineralogy 14:1 (1977);

Smith, "Origin and Structure of Zeolites" in Zeolite Chemistry and Catalysis, ACS Monograph 171 (American Chemical Society, 1976).

Zeolites X and Y are synthetic zeolites having aluminosilicate framework structures similar to that of the natural mineral faujasite. This structure is discussed in detail by Breck, Zeolite Molecular Sieves, John Wiley & Sons, New York (1974) at page 93 wherein the synthesis of these zeolites is also discussed at page 267. The Na-form can be characterized by the formula $$Na_2O \bullet Al_2O_3 \bullet x\ SiO_2 \bullet y\ H_2O$$

wherein x is from 2 to 3.0 for zeolite X and from greater than 3.0 to 6 for zeolite Y.

Zeolite A is a synthetic zeolite. The structure is discussed in detail by Breck, op. cit. p. 83 as is the synthesis at page 267. The Na-form can be characterized by the formula ti $Na_2O \bullet Al_2O_3 \bullet x\ SiO_2 \bullet y\ H_2O$ wherein x is from about 1.4 to 2.4. Breck, op. cit. p. 87, states that, in many preparations, chemical analyses of zeolite A have indicated a Si/Al ratio of slightly less than 1. Al-rich starting mixes may result in the occlusion of some $NaAlO_2$ in the zeolite cages, and the zeolite itself would have a higher Si/Al ratio. Starting mixtures in which $SiO_2/Al_2O_3 = 2$ yield a stoichiometric zeolite A.

Zeolites A, X, and Y are usually synthesized in the Na-forms. The Na cations in these zeolites can be exchanged by contacting the zeolites with solutions containing the cations of interest, e.g., Ca and Mg cations. Each zeolite will exhibit certain selectivities for different cations. Discussions of ion exchange reactions in zeolites are discussed in some detail in Breck, op. cit.

The presence of sodium ions is known to significantly increase the dielectric constant and dielectric loss. Therefore, it is desirable when making articles of this invention for use as substrates for electronic circuits to maximize removal of sodium cations in the zeolites used to make the ceramic. Two techniques by which this can be accomplished are by multiple ion exchanges with the cation of choice or by "pre-exchange" with a cation, such as $NH_4^+$, that does not significantly affect the dielectric properties, followed by ion exchange with the cation of choice. Forms of zeolites A, X, and Y that have been exchanged to the extent that the majority of the M cations (i.e., the cations other than Al and Si) are Ca, Mg, or mixtures thereof, will be referred to as Ca-, Mg- or (Ca,Mg)-forms. It should be understood, however, that whether the Na-form is directly exchanged with Ca ions, Mg ions, or mixtures thereof or first exchanged with ammonium ions and then exchanged with Ca ions, Mg ions, or mixtures thereof, there will be some sodium or sodium and ammonium ions in the resultant zeolite.

This invention provides a process for producing a monolithic ceramic article, said process comprising sintering at a temperature of from about 900° C. to about 1350° C. a shaped zeolite charge comprised of one or more zeolites chosen from the group consisting of zeolites with Si/Al ratios from about 0.7 to about 6. Preferred are zeolites with Si/Al ratios of from about 0.7 to about 3. Preferably, the ceramic article is prepared by sintering the shaped zeolite charge at a temperature of from about 950° C. to about 1050° C. Included in the group of zeolites with Si/Al ratios of from about 0.7 to about 6 are zeolites A, X, Y, and laumontite.

The zeolite charge is prepared as follows. If only one type of zeolite is used, the zeolite powder may be ground, e.g., in a mortar with a pestle or in an automatic grinder, or it may be used directly without grinding. If more than one type of zeolite is being used, the zeolite powders are ground until they are well mixed. The zeolite powder is then formed, e.g., pressed, into the desired shape of the article, e.g., a pellet, a tape, etc., with or without a binder. This shaped zeolite charge is then sintered at a temperature in the range indicated above, typically for about 3 hours, to produce the ceramic article.

This invention provides a preferred process for producing a monolithic anorthite, anorthite-cordierite or cordierite based ceramic article when the zeolites are chosen from the group consisting of the Ca-forms, the (Ca,Mg)-forms, and the Mg-forms of zeolites X, Y, and A. As indicated above in the discussion of zeolites, these zeolites have Si/Al ratios from about 0.7 to 3.

In other preferred embodiments, the process produces a monolithic anorthite, anorthite-cordierite or cordierite based ceramic article that is dense and hermetic when the zeolites are chosen from the group consisting of the Ca-forms, the (Ca,Mg)-forms, and the Mg-forms of zeolites X, Y, and A such that the shaped zeolite charge has a Si/Al ratio from about 1.1 to about 2.5. Preferably, the zeolite charge has a Si/Al ratio of from about 1.1 to about 1.4. Additionally, the preferred temperature for sintering the shaped zeolite charge is from about 950° C. to about 1050° C.

In the most preferred embodiment, the process produces a monolithic anorthite, anorthite-cordierite or cordierite based ceramic article that is dense and hermetic and is suitable for use as a substrate for electronic circuits when the shaped zeolite charge is sintered at a temperature of from about 950° C. to about 1350° C., preferably at a temperature of from about 950° C. to about 1050° C., and when the zeolites are chosen from the group consisting of the Ca-forms, the (Ca,Mg)-forms, and the Mg-forms of zeolites X, Y, and A such that the shaped zeolite charge has (i) a Si/Al ratio from about 1.1 to about 2.5, preferably from about 1.1 and about 1.4, (ii) a Na/(Si+Al) ratio less than about 0.08, preferably less than about 0.02, and (iii) a (Ca+Mg)/(Si+Al) ratio at least about 0.11.

The dense and hermetic ceramic article produced by the most preferred embodiment has low dielectric constant, low dielectric loss, high d.c. resistivity, and low thermal expansion (matching to that of Si), and therefore is suitable for microelectronic substrate applications. By dense is meant a density of at least about 90% of the theoretical density. By low dielectric constant and low dielectric loss is meant a dielectric constant measured at 1 MHz of less than about 7 and a dielectric loss (tan 67) measured at 1 MHz of less than about 0.005. By high d.c. resistivity is meant a d.c. resistivity greater than or equal to about $10^{12}$ ohm-m. By low thermal expansion (matching to that of Si) is meant a thermal expansion coefficient of about $3-5 \times 10^{-6}$° $C.^{-1}$, preferably about $4 \times 10^{-6}$° $C.^{-1}$.

To obtain a ceramic that is dense and hermetic, the zeolites used must be chosen from the group consisting of the Ca-forms, the (Ca,Mg)-forms, and the Mg-forms of zeolites X, Y, and A such that the shaped zeolite charge has a Si/Al ratio from about 1.1 to about 2.5. This range of Si/Al ratio has been arrived at from experiments wherein the zeolite charge was heated at a temperature in the preferred range, i. e., about 950° C.

to about 1050° C., for about 3 hours. This range of the Si/Al ratio to obtain dense and hermetic ceramics may be extended somewhat by heating for appreciably longer times and/or at higher temperatures. One object of this invention, however, is to produce the desired ceramic with a single firing and for the firing temperature to be relatively low, i. e., on the order of 1000° C., and the firing time to be relatively short, i. e., a few hours.

As indicated above, the presence of sodium ions significantly increases the dielectric constant and dielectric loss. To achieve low dielectric constant and low dielectric loss in articles for use in electronic ciruits, the Na/(Si+Al) ratio of the shaped zeolite charge must be less than about 0.08, preferably less than about 0.02. The (Ca+Mg)/(Si+Al) ratio of the zeolite charge must be at least about 0.11 to ensure that sufficient Ca and/or Mg is present and that there is not too much ammonium or some other cation.

The density, hermicity (water absorption), dielectric properties, d.c. resistivity, and coefficient of thermal expansion of the ceramic articles were measured by the following techniques.

Density measurements were carried out using a Micromeritics 1320 Helium Auto Pyknometer.

Hermicity was measured by two tests, a dye penetration test and a water absorption test. For the dye penetration test, a fired pellet was immersed for from 3 to about 16 hours in a bath of a dye that fluoresces under ultraviolet excitation. The pellet was removed from the bath, washed in water, rinsed in methanol, and dried in air. The pellet was fractured, and the surface of the pellet and the fracture were then exposed to radiation from an ultraviolet lamp to detect evidence of dye penetration. In the water absorption test, a fired pellet was weighed accurately and then immersed in boiling water for 3 hours. The pellet was removed and dried in air at 40° C. The pellet was weighed again and the weight gain, if any, was calculated. The sample was said to be hermetic if there was no evidence of dye penetration and/or the amount of water absorbed was 0%, within experimental error.

Dielectric measurements were performed on fired disks, 10 mm in diameter and 0.1 mm thick, which were prepared as described above. Gold electrodes were sputtered onto the flat surfaces of the disks. The capacitance C and the loss angle were measured at 1 MHz using a Hewlett-Packard 4275A LCR bridge, and the dielctric constant x was calculated from the formula $\kappa = (C \times t)/(\epsilon_0 \times A)$ wherein C is measured and the thickness of the sample t and the area of the electrode A are known for the sample. The symbol, $\epsilon_0$, denotes the permittivity constant. Resistivity measurements were carried out on samples of the type used for dielectric measurements. The measurements were performed using a Keithley 617 electrometer. A constant d.c. voltage of 50 to 100 volts was applied across the sample and the current was measured. The resistivity $\rho$ is calculated from the expression $\rho = (V \times A)/(I \times t)$ wherein V is the applied voltage, I is the measured current, and A and t are as defined above.

The coefficient of linear thermal expansion was measured using an Orton automatic recording dilatometer. The samples used were in the form of fired bars 1 inch (2.5 cm) in length and quartz was used as the standard.

The process of this invention is further illustrated by the following examples.

EXAMPLE 1

Zeolite Ca-X was prepared as follows. A 150 g sample of zeolite Na-X (Linde 13X, Union Carbide Corp.) was contacted with a 10% $NH_4NO_3$ solution three times for 1 hour each time at 90° C. with filtering between each contact to produce zeolite $NH_4$—X. The zeolite $NH_4$—X was contacted with a 10% $Ca(NO_3)_2 \bullet 4 H_2O$ solution three times for 1 hour each time at 90° C. with filtering between each contact. The resulting zeolite Ca—X has an approximate unit cell composition as determined by atomic absorption spectrometry of $Ca_{31.1}(NH_4)_{17.7}Na_{2.9}Al_{82.9}Si_{109.1}O_{384} \bullet 217 H_2O$ with $NH_4$ and O content assumed. The atomic absorption measurements showed that the composition of the zeolite was 14.94 wt% CaO, 33.22 wt% $Al_2O_3$, 51.21 wt% $SiO_2$, and 0.63 wt% $Na_2O$.

10 g of this hydrated zeolite Ca-X powder was ground in an agate mortar for 15 min. Pellets were formed by placing about 0.5 g of the ground zeolite in a 13 mm diameter pellet die that had been lubricated with Teflon TM spray and pressing at 7 tons/sq. inch (97 MPa). The pellets were removed from the die and heated at a rate of 1° C./min to 1000° C. and held at 1000° C. for 3 hours.

X-ray powder diffraction results obtained with the crushed sintered pellets showed the material to be predominantly triclinic anorthite (compared with Joint Center for Powder Diffraction Standards, JCPDS, File No: 12-301).

All measurements characterizing the ceramic pellets were carried out as indicated above. The density of the ceramic pellet is 2.61 g/cm³ compared to the powder density of 2.62 g/cm³. The water absorption was 0%. The dielectric constant measured at 1 MHz was 6.5 and the dielectric loss measured at 1 MHz was 0.0006. The d.c. resistivity was greater than $10^{13}$ ohm-cm. The coefficient of thermal expansion was $3.9 \times 10^{-6}$ °C.$^{-1}$. This anorthite based ceramic is suitable for use as a substrate for electronic circuits.

EXAMPLE 2

Zeolite Ca-A was prepared as follows. A 150 g sample of zeolite Na-A (Linde TM 4A, Union Carbide Corp.) was contacted with a 10% $NH_4NO_3$ solution three times for 1 hour each time at 90° C. with filtering between each contact to produce zeolite $NH_4$—A. Zeolite Ca—A was prepared by contacting the zeolite $NH_4$—A with a 10% $Ca(NO_3)_2 \bullet 4 H_2O$ solution three times for 1 hour each time with filtering between each contact. The resulting zeolite Ca—A has an approximate unit cell composition as determined by atomic absorption spectrometry of $Ca_{4.83}(NH_4)_{2.16}Na_{0.56}Al_{12.4}Si_{11.6}O_{48} \bullet 31 H_2O$ with $NH_4$ and O content assumed.

10 g of this hydrated zeolite Ca—A powder was ground in an agate mortar for 15 min. Pellets were formed by placing about 0.5 g of the ground zeolite in a 13 mm diameter pellet die that had been lubricated with Teflon TM spray and pressing at 7 tons/sq. inch (97 MPa). The pellets were removed from the die and heated at a rate of 1° C./min to 1100° C. and held at 1100° C. for three hours. X-ray powder diffraction results obtained with the crushed sintered pellets showed the material to be predominantly triclinic anorthite (compared with JCPDS File No: 12-301). The pellet was a monolithic, anorthite based ceramic article.

EXAMPLE 3

Zeolite Ca—Y was prepared as follows. A 50 g sample of zeolite Na—Y (Linde TM LZ-Y52, Union Carbide Corp.) was contacted with 10% NH$_4$NO$_3$ solution three times for 1 hour each time at 90° C. with filtering between each contact to produce zeolite NH$_4$—Y. Zeolite Ca—Y was prepared by contacting 10 g of the zeolite NH$_4$—Y material with 10% Ca(NO$_3$)$_2$•4 H$_2$O solution three times for 1 hour at 90° C. with filtering between each contact. The resulting zeolite Ca—Y has an approximate unit cell composition as determined by atomic absorption spectrometry of $Ca_{21.9}(NH_4)_{6.8}Na_{5.1}Al_{55.7}Si_{136.3}O_{384}\cdot 262H_2O$ with NH$_4$ and O content assumed.

10 g of this hydrated zeolite Ca—Y powder was ground in an agate mortar for 15 min. Pellets were formed by placing about 0.5 g of the ground zeolite in a 13 mm diameter pellet die that had been lubricated with Teflon TM spray and pressing at 5 tons/sq. inch (69 MPa). The pellets were removed from the die and heated at a rate of 1° C./min to 1000° C. and held at 1000° C. for three hours. X-ray powder diffraction results obtained with the crushed glassy pellets showed the material to be predominantly amorphous with small amounts of anorthite phase. This anorthite based ceramic is suitable for use as a substrate for electronic circuits.

EXAMPLES 4–13

Samples of zeolite X containing different amounts of Ca were prepared by contacting 20 g of zeolite Na—X (Linde TM 13X, Union Carbide Corp.) with solutions containing different amounts of Ca(NO$_3$)$_2$•4 H$_2$O at 90° C. and for different numbers of contacts with filtering between each contact. The approximate unit cell compositions of the resulting zeolites, as determined by atomic absorption spectrometry, are given in Table I in terms of wt % of the various oxides.

Pellets were formed by placing about 0.5 g of the ground zeolite in a 13 mm diameter pellet die that had been lubricated with Teflon TM spray and pressing at 7 tons/sq. inch (97 MPa). The pellets were removed from the die and heated at a rate of 1° C./min to 1050° C. and held at 1050° C. for three hours. X-ray powder diffraction results obtained with the crushed sintered pellets showed the material to be predominantly triclinic anorthite mixed with small amounts of nepheline (compared with JCPDS File Nos: 12-301 and 19-1176).

Characterization data for these pellets are given in Table I. Examples 4–8 demonstrate the preparation of monolithic, anorthite based ceramic articles that are dense and hermetic. Examples 9–13 demonstrate the preparation of anorthite based ceramics suitable for use as substrates for electronic circuits.

TABLE I

| Example | % SiO$_2$ | % Al$_2$O$_3$ | % CaO | % Na$_2$O | Dielectric Constant, κ @ 1 MHz | Dielectric Loss, tan δ @ 1 MHz |
|---|---|---|---|---|---|---|
| 4 | 47.2 | 32.5 | 0.1 | 20.2 | 14.4 | 0.1834 |
| 5 | 47.0 | 32.4 | 4.4 | 16.2 | 8.4 | 0.0448 |
| 6 | 47.4 | 32.6 | 8.5 | 11.6 | 8.2 | 0.0335 |
| 7 | 47.5 | 32.7 | 11.4 | 8.4 | 7.7 | 0.0231 |
| 8 | 47.3 | 32.6 | 13.0 | 7.2 | 7.4 | 0.0182 |
| 9 | 46.6 | 32.1 | 17.9 | 3.3 | — | 0.0025 |
| 10 | 47.9 | 33.0 | 17.5 | 1.6 | 6.6 | 0.0054 |
| 11 | 47.8 | 32.9 | 18.2 | 1.1 | 6.9 | 0.0009 |
| 12 | 47.8 | 32.9 | 18.6 | 0.7 | 6.6 | 0.0008 |
| 13 | 47.4 | 32.6 | 19.3 | 0.6 | 7.0 | 0.0008 |

EXAMPLES 14–28

In order to vary the Si/Al ratio in the starting precursors, zeolites Ca—X, Ca—A, and Ca—Y (prepared using substantially the same procedures as in Examples 1, 2, and 3, respectively) were mixed in various weight proportions as given in Table II. The mixtures were ground thoroughly for one-half hour in an agate mortar and subsequently in an automatic grinder for an additional hour. The approximate compositions of the resulting zeolite mixtures, as determined by atomic absorption spectrometry, are given in Table II in terms of wt % of the various oxides.

Pellets were formed by placing about 0.5 g of the ground zeolite in a 13 mm diameter pellet die that had been lubricated with Teflon TM spray and pressing at 7 tons/sq. inch (97 MPa). The pellets were removed from the die and heated at a rate of ° C./min to 1000° C. and held at 1000° C. for three hours. X-ray powder diffraction results obtained with the crushed pellets showed the material to be predominantly triclinic anorthite (compared with JCPDS file No: 12-301) except for Example 19, which was predominantly amorphous phase.

Characterization data for these pellets are given in Table III. Examples 14 and 15 demonstrate the preparation of monolithic, anorthite based ceramic articles. Examples 16–28 demonstrate the preparation of anorthite based ceramics suitable for use as substrates for electronic circuits.

TABLE II

| Example | Mixture | % SiO$_2$ | % Al$_2$O$_3$ | % CaO | % Na$_2$O |
|---|---|---|---|---|---|
| 14 | CaA | 45.5 | 38.0 | 14.8 | 1.7 |
| 15 | 0.8CaA:0.2CaX | 46.7 | 37.4 | 14.4 | 1.6 |
| 16 | 0.6CaA:0.4CaX | 47.9 | 36.7 | 13.9 | 1.5 |
| 17 | 0.4CaA:0.6CaX | 49.1 | 36.1 | 13.4 | 1.4 |
| 18 | 0.2CaA:0.8CaX | 50.4 | 35.4 | 12.9 | 1.3 |
| 19 | CaX | 51.7 | 34.7 | 12.4 | 1.2 |
| 20 | 0.8CaX:0.2CaY | 54.7 | 32.2 | 11.9 | 1.3 |
| 21 | 0.6CaX:0.4CaY | 57.6 | 29.7 | 11.4 | 1.3 |
| 22 | 0.4CaX:0.6CaY | 60.4 | 27.3 | 10.9 | 1.4 |
| 23 | 0.2CaX:0.8CaY | 63.2 | 24.9 | 10.5 | 1.4 |
| 24 | CaY | 65.9 | 22.6 | 10.0 | 1.5 |
| 25 | 0.8CaY:0.2CaA | 61.7 | 25.7 | 11.0 | 1.5 |
| 26 | 0.6CaY:0.4CaA | 57.6 | 28.9 | 12.0 | 1.6 |
| 27 | 0.4CaY:0.6CaA | 53.5 | 31.9 | 12.9 | 1.6 |
| 28 | 0.2CaY:0.8CaA | 49.5 | 35.0 | 13.9 | 1.6 |

TABLE III

| Example | Hermetic | Dielectric Constant, κ @ 1 MHz | Dielectric Loss, tan δ @ 1 MHz | Resistivity (ohm-cm) | Density (g/cm$^3$) |
|---|---|---|---|---|---|
| 14 | No | 6.8 | 0.0030 | >10$^{+12}$ | 2.41 |
| 15 | No | 6.3 | 0.0029 | >10$^{+12}$ | 2.31 |
| 16 | Yes | 6.6 | 0.0018 | >10$^{+12}$ | 2.46 |
| 17 | Yes | 6.6 | 0.0009 | >10$^{+13}$ | 2.55 |
| 18 | Yes | — | — | >10$^{+13}$ | 2.57 |
| 19 | Yes | 6.6 | 0.0008 | >10$^{+13}$ | 2.62 |
| 20 | Yes | 6.8 | 0.0013 | >10$^{+13}$ | 2.60 |
| 21 | Yes | 6.4 | 0.0021 | >10$^{+13}$ | 2.56 |
| 22 | Yes | 6.3 | 0.0032 | >10$^{+12}$ | 2.55 |
| 23 | Yes | 6.2 | 0.0037 | >10$^{+12}$ | 2.53 |
| 24 | Yes | 6.3 | 0.0075 | >10$^{+12}$ | 2.48 |

TABLE III-continued

| Example | Hermetic | Dielectric Constant, κ @ 1 MHz | Dielectric Loss, tan δ @ 1 MHz | Resistivity (ohm-cm) | Density (g/cm³) |
|---|---|---|---|---|---|
| 25 | Yes | 6.5 | 0.0040 | >10^+12 | 2.48 |
| 26 | Yes | 6.6 | 0.0032 | >10^+13 | 2.47 |
| 27 | Yes | 6.6 | 0.0027 | >10^+12 | 2.45 |
| 28 | Yes | 7.0 | 0.0028 | >10^+13 | 2.54 |

EXAMPLE 29

Zeolite (Ca,Mg)—X was prepared as follows A 400 g sample of zeolite Na-X (Linde 13X, Union Carbide Corp.) was contacted with a 10% $NH_4NO_3$ solution three times for 1 hour each time at 90° C. with filtering between each contact to produce zeolite $NH_4$—X. The zeolite Ca—X was prepared by contacting zeolite $NH_4$—X with a 10% $Ca(NO_3)_2 \cdot 4\ H_2O$ solution three times for 1 hour each time at 90° C. with filtering between each contact. A 20 g sample of zeolite Ca—X was contacted with a 10% solution of $Mg(NO_3)_2 \cdot 6\ H_2O$ four times for 1 hour each time with filtering between each contact. The resulting powder was thoroughly washed with $H_2O$. The resulting zeolite (Ca,Mg)—X has an approximate unit cell composition as determined by atomic absorption spectrometry of

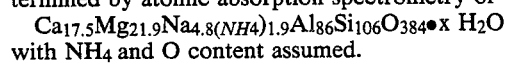
$Ca_{17.5}Mg_{21.9}Na_{4.8}(NH_4)_{1.9}Al_{86}Si_{106}O_{384} \cdot x\ H_2O$ with $NH_4$ and O content assumed.

Pellets were formed by placing about 0.5 g of the ground zeolite in a 13 mm diameter pellet die that had been lubricated with Teflon TM spray and pressing at 7 tons/sq. inch (97 MPa). The pellets were removed from the die and heated at a rate of 1° C./min. The pellets were heated to different final temperatures, 900° C., 1000° C., 1050° C., 1200° C, 1300° C., and 1400° C., and held at those final temperatures for three hours. The phases observd in X-ray powder diffraction patterns obtained with the crushed sintered pellets are given in Table IV, along with the dielectric properties.

Firing at 900° C. demonstrates the preparation of a monolithic, anorthite based ceramic article that is dense and hermetic. The firings at temperatures from 1000° C. to 1300° C. demonstrate the preparation of anorthite-cordierite based ceramics suitable for use as substrates for electronic circuits.

TABLE IV

| Sintering Temp. ° C. | Phases Formed | Dielectric Constant, κ @ 1 MHz | Dielectric Loss, tan δ @ 1 Mhz |
|---|---|---|---|
| 900 | Anorthite + Quartz | 7.5 | 0.0040 |
| 1000 | Cordierite + Anorthite + | 6.1 | 0.0014 |
| 1050 | Cordierite + Anorthite + Quartz | 6.0 | 0.0020 |
| 1200 | Cordierite + Anorthite + Quartz | 5.6 | 0.0015 |
| 1300 | Cordierite + Anorthite | 5.3 | 0.0013 |
| 1400 | Mullite + Glass | — | — |

EXAMPLE 30

About 1.5 grams of zeolite laumontite (from Halls Harbor, Nova Scotia), having a Si/Al ratio of 2, was crushed in an agate mortar. Pellets were formed by placing about 0.5 g of the ground zeolite in a 13 mm diameter pellet die that had been lubricated with Teflon TM spray and pressing at 7 tons/sq. inch (97 MPa). The pellets were removed from the die and heated at a rate of 1° C./min to ° C. and held at 1000° C. for three hours. X-ray powder diffraction results obtained with the crushed pellets showed that the material was predominantly amorphous phase with a very little anorthite this example demonstrates the preparation of a monolithic ceramic article.

EXAMPLE 31

Zeolite Ba-X was prepared as follows. A 100 g sample of zeolite Na-X (Linde 13X, Union Carbide Corp.) was contacted with a 10% $NH_4NO_3$ solution six tmes for 1 hour each time at 90° C. with filtering between each contact to produce zeolite $NH_4$—X. Zeolite Ba—X was prepared by contacting the zeolite $NH_4$—X with a 5% $Ba(NO_3)_2$ solution three times for 1 hour each time at 90° C. with filtering between each contact. The resulting zeolite Ba—X has an approximate unit cell composition as determined by atomic absorption spectrometry of

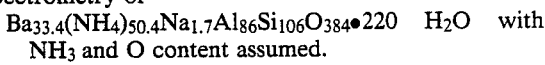
$Ba_{33.4}(NH_4)_{50.4}Na_{1.7}Al_{86}Si_{106}O_{384} \cdot 220\ H_2O$ with $NH_3$ and O content assumed.

10 g of this hydrated zeolite Ba—X powder was ground in an agate mortar for 15 min. Pellets were formed by placing about 0.5 g of the ground zeolite in a 13 mm diameter pellet die that had been lubricated with Teflon TM spray and pressing at 7 tons/sq. inch (97 MPa). The pellets were removed from the die and heated at a rate of 1° C./min to 1000° C. and held at 1000° C. for three hours. X-ray powder diffraction results obtained with the crushed sintered pellets showed the material to be predominantly hexagonal $BaAl_2Si_2O_8$ (compared with JCPDS File No: 19-90). This example demonstrates the preparation of a monolithic ceramic article.

EXAMPLE 32

Zeolite Sr-X was prepared as follows. A 100 g sample of zeolite Na—X (Linde 13X, Union Carbide Corp.) was contacted with a 10% $NH_4NO_3$ solution six times for 1 hour-each time at 90° C. with filtering between each contact to produce zeolite $NH_4$—X. Zeolite Sr—X was prepared by contacting the zeolite $NH_4$—X with a 10% $Sr(NO_3)_2$ solution six times for 1 hour each time at 90° C. with filtering between each contact.

10 g of this hydrated zeolite Sr—X powder was ground in an agate mortar for 15 min. Pellets were formed by placing about 0.5 g of the ground zeolite in a 13 mm diameter pellet die that had been lubricated with Teflon TM spray and pressing at 7 tons/sq. inch (97 MPa). The pellets were removed from the die and heated at a rate of 1° C./min to 1000° C. and held at 1000° C. for three hours. X-ray powder diffraction results obtained with the crushed sintered pellets showed the material to be predominantly $SrAl_2Si_2O_8$ (compared with JCPDS File No: 14–588). This example demonstrates the preparation of a monolithic ceramic article.

EXAMPLE 33

Zeolite K—X was prepared as follows. A 100 g sample of zeolite Na—X (Linde 13X, Union Carbide Corp.) was contacted with a 5% $KNO_3$ solution three times for 1 hour each time at 90° C. with filtering between each contact to produce zeolite K—X. The resulting zeolite K—X has an approximate unit cell composition as determined by atomic absorption spectrometry of

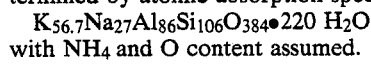
$K_{56.7}Na_{27}Al_{86}Si_{106}O_{384} \cdot 220\ H_2O$ with $NH_4$ and O content assumed.

10 g of this hydrated zeolite K—X powder was ground in an agate mortar for 15 min. Pellets were formed by placing about 0.5 g of the ground zeolite in a 13 mm diameter pellet die that had been lubricated with Teflon ™ spray and pressing at 7 tons/sq. inch (97 MPa). The pellets were removed from the die and heated at a rate of 1° C./min to 1000° C. and held at 1000° C. for three hours. X-ray powder diffraction results obtained with the crushed sintered pellets showed the material to be predominantly $KAlSi_2O_6$ (compared with JCPDS File No: 15–47). This example demonstrates the preparation of a monolithic ceramic article.

What is claimed is:

1. A process for producing a monolithic ceramic article comprising sintering at a temperature from about 900° C. to about 1350° C. a shaped zeolite charge comprised of one or more zeolites having Si/Al atomic ratios from about 0.7 to about 3 selected from the group consisting of zeolites of the Ca-forms of zeolites X, Y, and A, the (Ca, Mg)-forms of zeolites X, Y, and A, and the Mg-forms of zeolites X, Y, and A, with the resulting ceramic article being anorthite, cordierite, or anorthite-cordierite based.

2. A process according to claim 1 wherein the Si/Al ratio of the shaped zeolite charge is from about 1.1 to about 2.5, with the resulting ceramic being dense and hermetic.

3. A prpocess according to claim 2 wherein the Si/Al atomic ratio of the shaped zeolite charge is from about 1.1 to about 1.4.

4. A process for producing a monolithic, dense, hermetic ceramic article that is anorthite, cordierite, or anorthite-cordierite based and suitable for use as a substrate for electronic circuits comprising sintering at a temperature from about 950° C. to about 1350° C. a shaped zeolite charge comprised of one or more zeolites having Si/Al atomic ratios from about 0.7 to about 3 selected from the group consisting of the Ca-forms of zeolites X, Y, and A, the (Ca, Mg)-forms of zeolites X, Y, and A, and the Mg-forms of zeolites X, Y, and A, wherein the shaped zeolite charge has a Si/Al atomic ratio from about 1.1 to about 2.5, a Na/(Si+Al) atomic ratio less than about 0.08 and a (Ca+Mg)/(Si+Al) atomic ratio of at least about 0.11.

5. A process according to claim 4 wherein the Si/Al atomic ratio of the shaped zeolite charge is from about 1.1 to about 1.4.

6. A process according to claims 4 or 5 wherein the Na/(Si+Al) ratio of the shaped zeolite charge is less than about 0.02.

7. A process according to claim 6 wherein the temperature is from about 950° C. to about 1050° C.

8. A process according to claims 1, 2, 3, 4 or 5 wherein the temperature is from about 0° C. to about 1050° C.

* * * * *

UNITED STATES PATENT AND TRADEMARK OFFICE
CERTIFICATE OF CORRECTION

PATENT NO. : 4,814,303

DATED : March 21, 1989

INVENTOR(S) : Uma Chowdhry et al.

It is certified that error appears in the above-identified patent and that said Letters Patent is hereby corrected as shown below:

Column 14, line 27, "wherein the temperature is from about 0° C. to about" should read --wherein the temperature is from about 950° C. to about--.

Signed and Sealed this

Thirty-first Day of December, 1991

Attest:

HARRY F. MANBECK, JR.

*Attesting Officer*    *Commissioner of Patents and Trademarks*